United States Patent [19]

Thornton et al.

[11] 4,106,523
[45] Aug. 15, 1978

[54] INTERCONNECT DEVICE FOR USE IN CLOSED FLUID CIRCULATING SYSTEMS

[75] Inventors: David Charles Thornton, Harrisburg; Linn Stephen Lightner, Camp Hill; Patrick Edward Lannan, Harrisburg, all of Pa.

[73] Assignee: AMP Incorporated, Harrisburg, Pa.

[21] Appl. No.: 571,129

[22] Filed: Apr. 24, 1975

Related U.S. Application Data

[62] Division of Ser. No. 501,541, Aug. 29, 1974, Pat. No. 3,917,370.

[51] Int. Cl.² .............................................. F16K 29/00
[52] U.S. Cl. .................................................. 137/614.04
[58] Field of Search .................. 137/614.04, 614.01, 137/614.02, 614.03; 285/99, 352

[56] References Cited

U.S. PATENT DOCUMENTS

| 541,714 | 6/1895 | Bottomly et al. | 137/614.04 |
|---|---|---|---|
| 2,330,413 | 9/1943 | Eaton | 137/614.04 |
| 2,689,140 | 9/1954 | Bonacci | 285/99 |
| 3,052,488 | 9/1962 | Bruning | 137/614.04 |
| 3,052,489 | 9/1962 | Stoudt | 285/352 |
| 3,196,897 | 7/1965 | Hodson | 137/614.04 |
| 3,283,780 | 11/1966 | Sutton | 137/614.04 |
| 3,525,361 | 8/1970 | Cerbin et al. | 137/614.04 |
| 3,831,984 | 8/1974 | Kutina et al. | 285/352 |

FOREIGN PATENT DOCUMENTS

| 479,943 | 7/1929 | Fed. Rep. of Germany | 137/614.04 |
|---|---|---|---|
| 1,013,131 | 8/1957 | Fed. Rep. of Germany | 137/614.04 |

Primary Examiner—William R. Cline
Assistant Examiner—H. Jay Spiegel
Attorney, Agent, or Firm—Russell J. Egan

[57] ABSTRACT

An interconnect device for joining disengagable portions of a closed fluid circulating system is disclosed. The interconnect device is employed at any point in the system where it may be desirable to open or disconnect the system, for example to facilitate replacement of parts in a coolant system for high density electronic equipment applications. The interconnect device, since a fluid is involved, is arranged to automatically shut off fluid flow any time the mating members are separated thereby preventing loss of fluid in the circuit.

2 Claims, 8 Drawing Figures

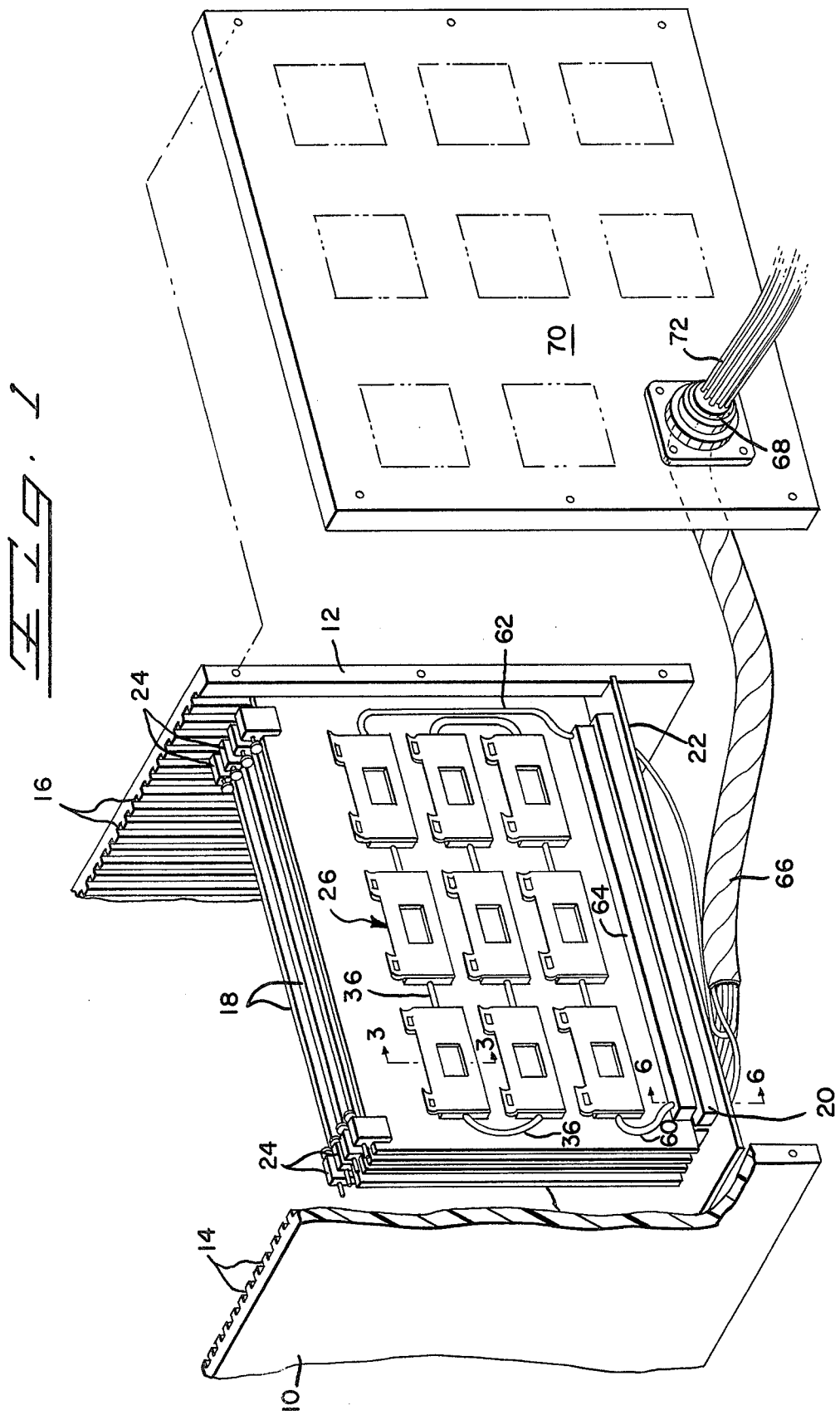

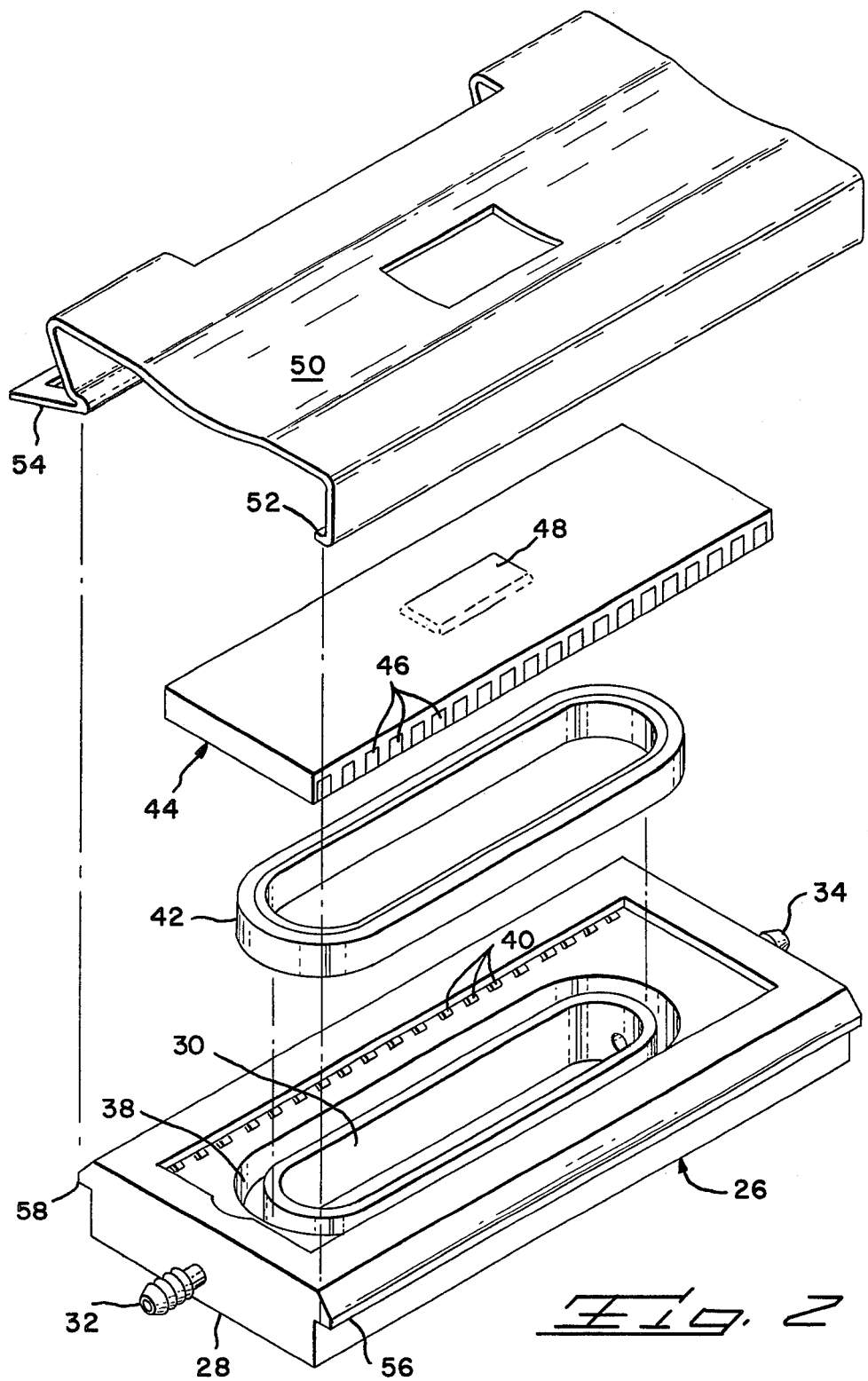

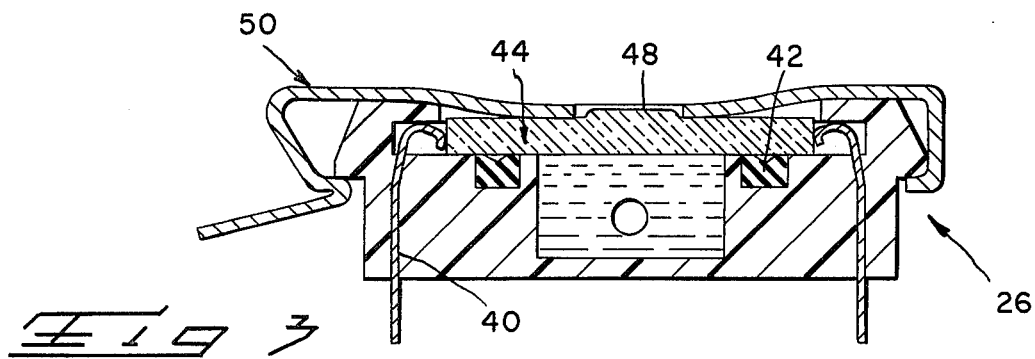
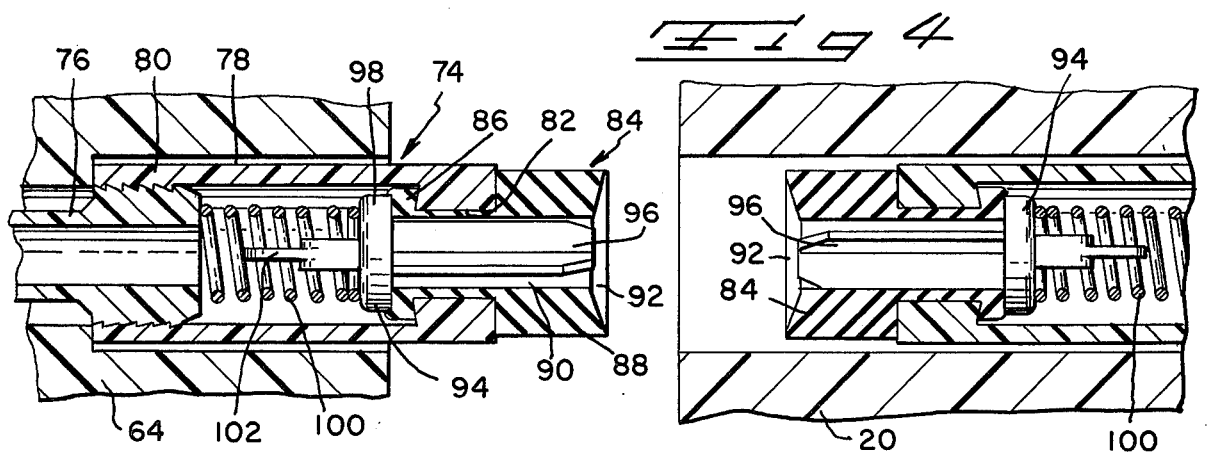
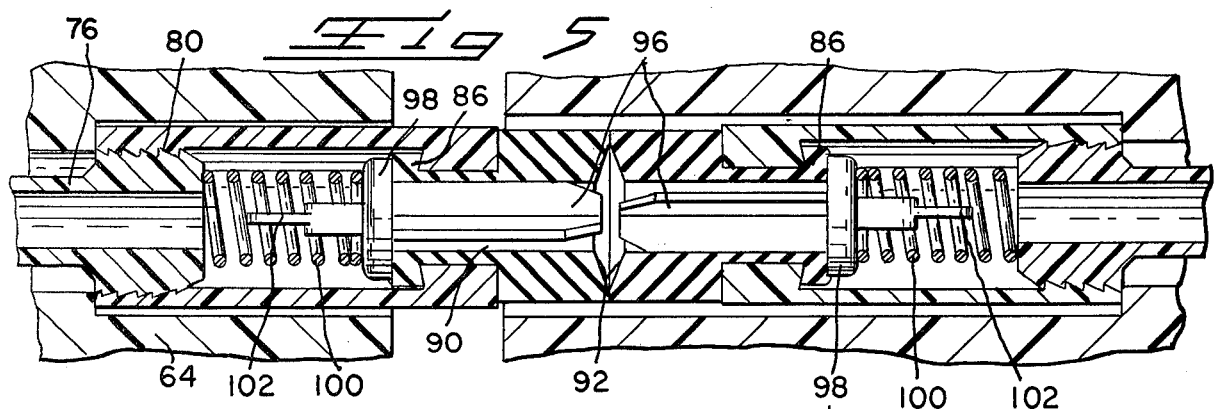
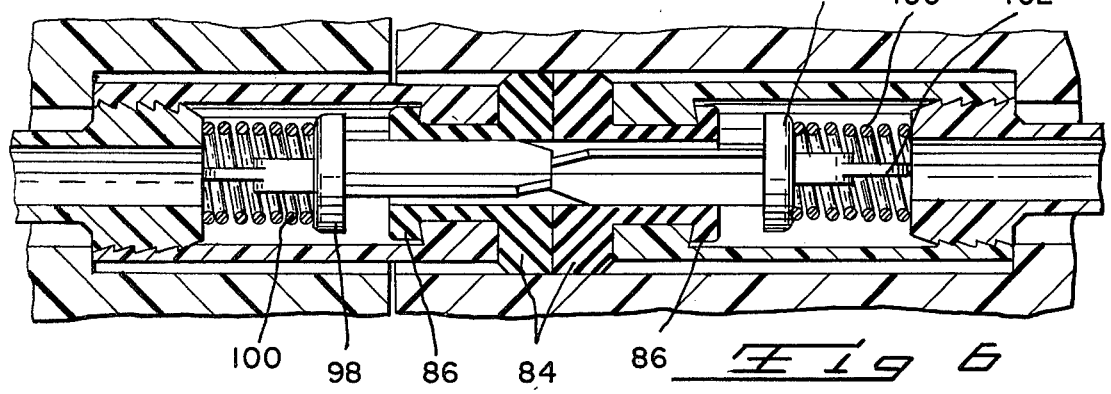

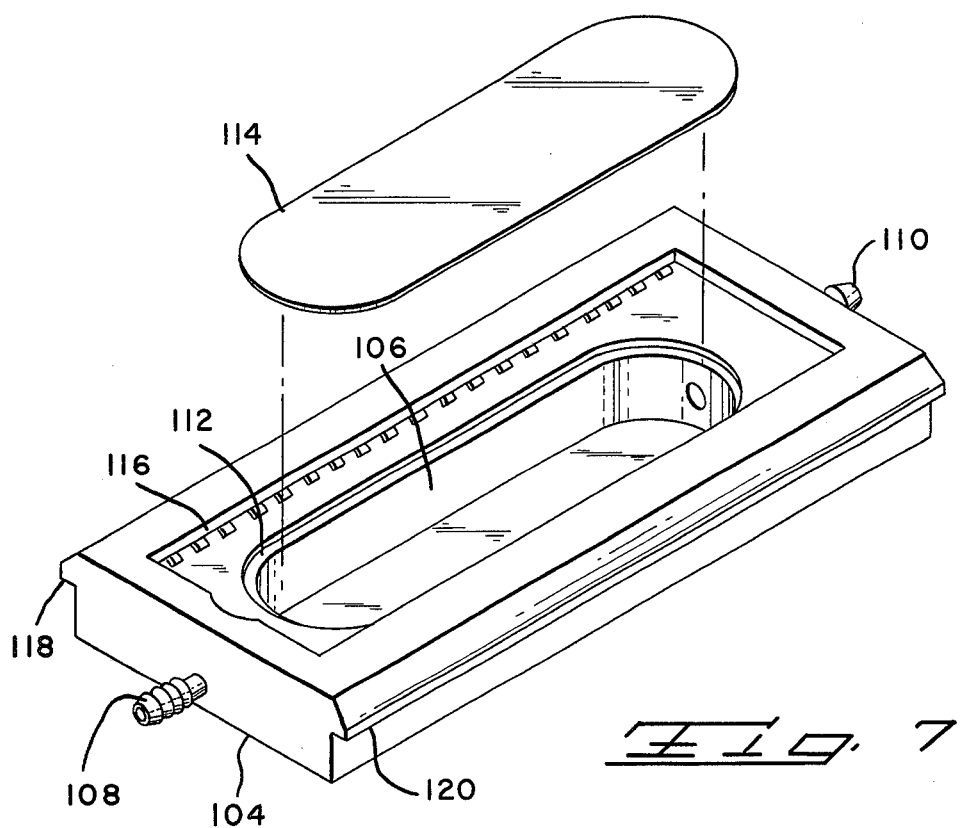
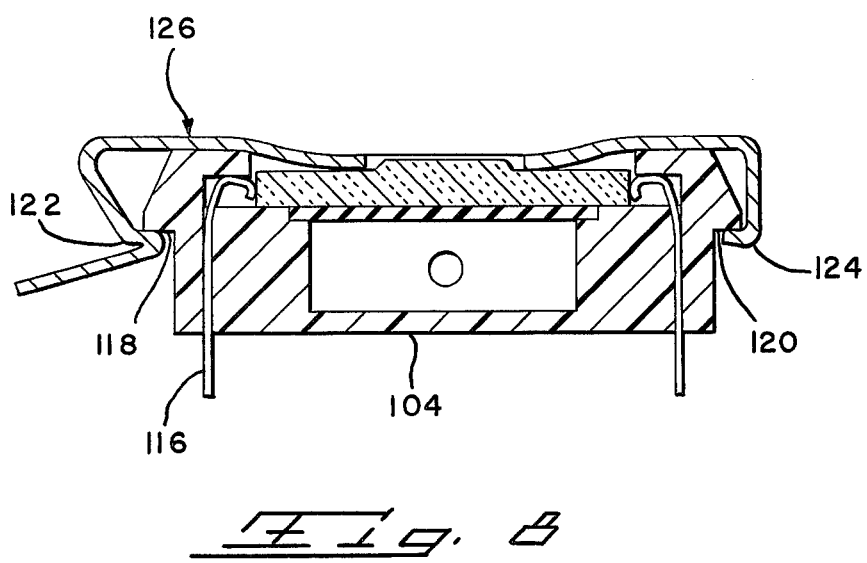

INTERCONNECT DEVICE FOR USE IN CLOSED FLUID CIRCULATING SYSTEMS

This is a division of application Ser. No. 501,541, filed Aug. 29, 1974, now U.S. Pat. No. 3,917,370.

BACKGROUND OF THE INVENTION

1. Field of The Invention

The present invention relates to an interconnect device for use in closed fluid circulating systems, such as cooling systems for high density electronic systems, and in particular to an interconnect device which automatically closes to prevent loss of fluid from the system when mating members of the device are separated.

2. Prior Art

It has been the custom in the electronics industry to rely on natural convection and radiation to cool electronics equipment. Frequently air flow over and about the equipment is supplemented by fans or other means to circulate the air to increase the amount of cooling. Even the forced circulation of air does not always provide adequate cooling and thus attempts have been made to provide closed fluid cooling systems which circulate a cooling fluid through the subject system to provide adequate cooling. Such fluid cooling systems include both liquid cooling and vaporization cooling. Liquid cooling systems cool at a much higher rate than natural radiation and convection cooling and vaporization cooling is approximately twice as efficient as liquid cooling, assuming substantially the same conditions.

A particular area in electronics where the use of fluid cooling systems is being considered is high density applications of integrated circuit type devices. Integrated circuit devices are commonly mounted on relatively thin ceramic plates, commonly referred to as substrates, which have conductors thereon extending from the integrated circuit device or "chip" to the marginal portions of one face of the substrate. Enlarged contact areas or contact pads are formed at the ends of the substrate conductors on one of the faces of the substrate for connecting these substrate conductors to external conductors. The substrate conductors are commonly connected to the external conductors by multi-contact electrical connectors and a variety of types of connectors have been developed for use with previously known designs of ceramic substrates. More recently, and for reasons dictated by substrate manufacturing considerations and other reasons, substrates have been introduced which have their contact pad portions located on their sides rather than on their faces. The numbers of these integrated circuit devices mounted on a single card has been increasing to the extent that lead conduction and case radiation will no longer allow sufficient heat transfer to obtain function temperatures.

The increased cooling efficiency of an internal liquid flow system can be appreciated by comparing the order of magnitude of convective heat transfer coefficients, which are 5–50 BTU/hr. sq. ft. °F for forced air, and 50–2000 BTU/hr. sq. ft. °F for water. The formula for heat transfer by means of water through a system, according to the Federal Engineering Handbook, is P watts = 264 Qw ($T_{2-T1}$)

where

P watts = watts of power absorbed
Qw = flow in gallons per minute
$T_1$ = the outlet temperature in degrees centigrade
$T_2$ = the inlet temperature in degree centigrade.

Converting to gallons per hour P watts = 4.4 Qw T.

Assuming a maximum temperature of 20° centigrade, the heat transfer is 85 watts per gallon per hour for water. However, some systems are more likely to use a liquid with a lower freezing point, such as ethyl-glycol, in a liquid cooling system. Ethyl-glycol has a specific heat of 0.571 at 14.9° and approximately 0.6 at 30° C. The same temperature rise of 20° would then conduct approximately 53 watts at a flow rate of 1 gallon per hour. With a maximum junction temperature of 60° C, as recommended by some reliability sources, and a junction to case or heat sink gradiant of 20° C, the cold plate temperatures would be limited to 40° C with ethyl-glycol and inlet temperature could be below freezing. However, an inlet temperature of 0° C is a good starting point and will provide over 100 watts of cooling at 1 gallon an hour of fluid flow.

A typical fluid coolant system for an electronic application would include the following components: a refrigeration and heat exchange; a cooling fluid pump; flexible interconnection conduits; main loop connection devices; distributors; connecting devices between distributors and individual panels or units; connecting devices between panels to boxes and to card cage rails; connecting devices from the back plane to printed circuit cards; and cold plate devices on the cards upon which LS1 devices are mounted. Since this system is a closed fluid system, each point where there is a connecting device must be provided with means which, when the members of the connecting device are separated, prevent the undesirable draining of the cooling fluid from the system. When the fluid system is to be used in conjunction with electronic apparatus, then each of the connections must also provide for electrical interconnection. Composite electrical and fluid connectors of the above described general type are known in the art, for example see U.S. Pat. No. 3,673,541. However, most of these connections, because of size requirements, do not provide adequate means to seal the fluid system whenever the connector is disconnected or opened.

SUMMARY OF THE PRESENT INVENTION

The present invention concerns an interconnect device for use in closed fluid circulating systems, of the above discussed type and the like, in which each point in the fluid system subject to being disconnected is provided with a device which, upon disconnect, seals both portions of the system to prevent escape of the fluid circulating therein. The interconnect device comprises a pair of identical, mating fitting members each having one end adapted to be coupled to conduit of the fluid system. The mating ends of each member are provided with valve means adapted to engage and be actuated in opening and closing directions by relative mating and uncoupling movement, respectively, of the members.

It is therefore an object of the present invention to produce an interconnect device for closed fluid circulating systems which device will prevent loss of the circulating fluid whenever any point in the closed fluid circulating system provided with the interconnect device is opened.

It is another object of the present invention to produce a fluid interconnect device that is size compatible with existing connectors, cabling and interconnection arrangements used in electronic apparatus.

It is still another object of the present invention to produce a fluid interconnect device which will, upon disconnection, assure fluid tightness of a closed fluid circulating system and prevent leakage of fluid from the system.

It is yet another object of the present invention to produce a self-sealing fluid interconnect device for use in self contained fluid circulating systems.

It is a further object of the present invention to produce a closed fluid circulating system which has a high degree of design flexibility.

It is a still further object of the present invention to produce a fluid interconnect device for closed fluid circulating systems which device can be readily and economically produced.

The means for accomplishing the foregoing and other objects and advantages of the present invention will become clear from the following detailed description taken with reference to the accompanying drawings.

BRIEF DESCRIPTION OF THE DRAWINGS

FIG. 1 is an exploded perspective view of an electronic system having a closed fluid cooling system incorporating the subject interconnection device;

FIG. 2 is an exploded perspective view of an open fluid header and integrated circuit device from the system of FIG. 1;

FIG. 3 is a vertical transverse section through the header of FIG. 2;

FIG. 4 is a longitudinal section through an interconnect device according to the subject invention showing the device in a fully disconnect or unmated condition;

FIG. 5 is a section, similar to FIG. 4, showing the interconnect device in a partially engaged or partially mated condition;

FIG. 6 is a section, similar to FIGS. 4 and 5, showing the interconnect device in a fully engaged or fully mated condition;

FIG. 7 is an exploded perspective view, similar to FIG. 2, showing a cold plate header; and FIG. 8 is a vertical transverse section through the cold plate header of FIG. 7.

DETAILED DESCRIPTION OF THE PREFERRED EMBODIMENT

A single panel or bay of an electronic apparatus, similar to that shown in U.S. Pat. No. 3,711,814, incorporating a high density of integrated circuit devices mounted on printed circuit boards or cards is shown in FIG. 1. The apparatus, which can be, for example, a portion of a computer, includes a pair of spaced parallel frame members 10, 12 each provided with a plurality of parallel, spaced apart grooves 14, 16 adapted to receive a plurality of circuit boards 18 in respective pairs of the grooves. A like plurality of printed circuit board edge connectors 20 are positioned on a base 22 extending between the side walls 10, 12. Each circuit board 18 is provided at its upper end with a locking means 24 which lockingly secure the respective boards in position in the edge connectors 20.

The integrated circuits on the individual boards are arranged to be cooled by a closed fluid circulating cooling system. Mounted on each board are a plurality of fluid cooled headers 26, shown in greater detail in FIGS. 2, 3, 7 and 8. Each header 26 includes a base 28 having a central flow chamber 30 connected at opposite ends to inlet 32 and outlet 34. The inlet and outlet are each provided with conventional means, such as the annular ridges shown, for making fixed connection to fluid carrying conduits 36. An elongated groove 38 is formed in the base spaced from the edge of chamber 30.

A plurality of electrical contacts 40 are disposed along at least two opposite edges of the header. These contacts can be of the type described in U.S. Pat. No. 3,753,211 for example. An annular gasket 42 of suitable resilient material is received in the groove 38 and makes sealing contact between the base and the substrate 44. The substrate 44 includes a plurality of contact pads 46 along opposite side surfaces, each pad permanently connected to integrated circuit chip 48 and adapted to make contact with a respective electrical contact 40. The header cover 50 has first and second parallel spaced flanges 52, 54, respectively, which are adapted to engage over oppositely directed shoulders 56, 58, respectively, on the header base 28. The headers are fixed to the boards 18 by conventional means, not shown, and are interconnected by fluid conduits 36 and by fluid conduits 60, 62 to the connector 64 on the edge of each board 18. The edge connector 64 is adapted to make both electrical and fluid flow connection with the connector 20. A fluid and electrical distribution cable 66 is shown connecting the individual connectors 20 to a unit or bay to a connector 68 mounted on a front panel 70. A similar fluid and electrical distribution cable 72 connects the panel to the fluid distribution portion of a typical fluid cooling system as discussed above.

At each of the interconnect positions in the closed fluid circuit of FIG. 1, namely between the connectors 20 and 64 and in the mating halves of the connector 68, each fluid line is provided with a fluid interconnect device 74 according to the present invention and shown in greater detail in FIGS. 4 to 6. Each device 74 comprises a fitting 76 one end of which engages, by conventional means (not shown), the appropriate associated conduit (also not shown). The other end of fitting 76 engages the body 78 of the device by means of a plurality of conventional annular ridges 80. The body 78 of the device has a narrowed opening 82 at the opposite end from fitting 76. A resilient seal member 84 is mounted in the narrow opening 82 with an annular flange 86 inside the body and an enlarged profiled head 88 outside the body holding the seal member in place against body 78. The seal also has an axial bore 90 which is joined to a shallow conical entrance 92. A valve member 94 is mounted in the body 78 with integral stem 96 passing through bore 90. The head 98 of the valve member 94 is biased against the flange 86 of seal 84 by spring 100. A stop 102 projects from the head 98 of valve member 94 in the opposite direction from the stem 96.

It should be noted that the mating halves of the interconnect device are identical. The device on the left of FIGS. 4 to 6 has been mounted as a plug member projecting from an associated housing, for example connector 64, while the member on the right is recessed as a receptacle in an associated housing, for example connector 20. The same conditions would apply for the mating halves of connector 68.

The steps of engaging the subject interconnect device are shown in FIGS. 4 to 6. FIG. 4 shows the separated or fully disconnected position of the device. In this position the heads 98 of both valve members 94 are biased against flanges 86 of seals 84 by springs 100 to prevent fluid flow through the device. When the devices are initially engaged, as shown in FIG. 5, the free ends of the seals 84 engage and are compressed against each other to form a leak proof passageway through the aligned axial bores 90. As the relative movement of the devices towards one another continues, the free ends of the valve stems 96 engage and begin to open the valves 94 against the biasing force of springs 100 to establish fluid flow therethrough. The stops 102 on the end of each valve 94 eliminates the possibility of only one valve opening while the other valve stays closed. If one valve sticks in the closed position the stop of the other valve will abut its related fitting 76 so that all force bringing the devices together will be applied against the stuck valve.

Full fluid communication between the mated devices is shown in FIG. 6. Uncoupling of the devices produces a reverse action to that described above. As the valves 94 are closed by springs 100 the seals 84 expand to take up any excess fluid thereby preventing undue leakage of the fluid from the system.

The alternate header, known as a cold plate header, is shown in FIGS. 7 and 8. The cold plate header functions substantially the same as the header described above with reference to FIGS. 2 and 3. There may, however, be times when it is desirable to have the fluid circulating system completely sealed so that individual integrated circuits 44 can be replaced without removing the associated board 18 from the frame. In such cases a cold plate header as shown in FIGS. 7 and 8 would be used.

The header base 104 is similar to base 28 in that it has a central cavity 106 connected to inlet 108 and outlet 110. However, instead of groove 38 surrounding the central, there is a step 112 extending around the upper edge of the cavity. A cold plate 114 is mounted with its peripheral edge sealed in the step 112 to provide a permanent closure of the central cavity. The cold plate 114 can be made of any fluid tight material, such as an elastomer, thin metal film or aluminum filled rubber, and sealed in the step by any known manner, such as by ultrasonic welding or by known adhesives. The cold plate header also includes contacts 116 fixed along opposite sides thereof and shoulders 116, 118 adapted to receive flanges 122, 124 of cover 126.

The coolant is pumped through the chamber of the cold plate header taking heat out of the integrated circuit mounted thereon. The substrate 44 lays against the cold plate 114 and heat is transferred from the substrate to the coolant via the cold plate.

It is foreseen that the present invention may be subject to many changes and modifications without departing from the spirit or essential characteristics thereof. The present embodiments are therefore to be considered in all respects as illustrative and not restrictive of the scope of the invention.

What is claim is:

1. An interconnect device for conduits of closed fluid circulating systems comprising:
   a pair of mating hermaphroditic members each comprising:
   a body having a bore extending therethrough;
   means on one end of said body for fixed connection of said bore to associate conduits;
   a resilient sealing member fixedly mounted on said body extending from the opposite end thereof and having a bore coaxial with and forming an extension of the bore in said body;
   a valve member movably mounted in said body, said valve member having a head portion adopted to engage said sealing member and an integral stem lying entirely within the bore of said sealing member in a normally closed condition, a stop integral with each valve head portion and extending in the opposite direction from said stem; and
   spring means biasing said valve head portion against said seal;
   whereby relative movement of said mating members towards one another causes a sealing engagement to be established between said sealing members prior to said valve stems engaging to move the associated valve head portions away from said sealing members to allow fluid flow through said coupled members, each said stop limiting opening movement of the respective valve member to less than the mating movement of said device thereby assuring opening of both valve members.

2. An interconnect device according to claim 1 further comprising:
   a pair of mating housing members, one of said housing members having at least one of said hermaphroditic members mounted therein in receptacle fashion and the other of said housing members having at least one of said hermaphroditic members mounted to extend therefrom in plug fashion.

* * * * *